(12) United States Patent
Petri et al.

(10) Patent No.: US 11,500,294 B2
(45) Date of Patent: Nov. 15, 2022

(54) METHOD FOR REPLACING A MIRROR IN A PROJECTION EXPOSURE APPARATUS, AND POSITION- AND ORIENTATION DATA MEASURING DEVICE FOR CARRYING OUT THE METHOD

(71) Applicant: Carl Zeiss SMT GmbH, Oberkochen (DE)

(72) Inventors: Christoph Petri, Oberkochen (DE); Daniel Runde, Oberkochen (DE); Florian Baumer, Oberkochen (DE); Ulrich Mueller, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 17/340,052

(22) Filed: Jun. 6, 2021

(65) Prior Publication Data
US 2021/0294222 A1 Sep. 23, 2021

Related U.S. Application Data

(63) Continuation of application No. PCT/EP2019/083811, filed on Dec. 5, 2019.

(30) Foreign Application Priority Data

Dec. 6, 2018 (DE) ..................... 10 2018 221 128.0

(51) Int. Cl.
*G03F 7/20* (2006.01)
*G01M 11/02* (2006.01)
(Continued)

(52) U.S. Cl.
CPC ..... *G03F 7/70141* (2013.01); *G01M 11/0207* (2013.01); *G02B 5/09* (2013.01); *G02B 27/62* (2013.01); *G03F 7/7085* (2013.01)

(58) Field of Classification Search
CPC .............. G03F 7/70141; G03F 7/7085; G01M 11/0207; G02B 5/09; G02B 27/62
See application file for complete search history.

(56) References Cited

U.S. PATENT DOCUMENTS 6,658,084 B2  12/2003  Singer
6,859,515 B2  2/2005  Schultz et al.
(Continued)

FOREIGN PATENT DOCUMENTS

DE  10 2008 021 833 A1  7/2009
DE  10 2012 209 412 A1  12/2013
(Continued)

OTHER PUBLICATIONS

International Search Report, PCT/EP2019/083811, dated Jan. 31, 2020, 2 pages.
(Continued)

*Primary Examiner* — Hung V Nguyen
(74) *Attorney, Agent, or Firm* — Edell, Shapiro & Finnan, LLC

(57) ABSTRACT

When replacing a mirror in a projection exposure apparatus, a mirror for replacement is initially removed (41). Position- and orientation data of the removed mirror for replacement are measured (43) by a position -and orientation data measuring device. Furthermore, position- and orientation data of a replacement mirror, to be inserted in place of the mirror for replacement, are measured (46) using the position- and orientation data measuring device. Bearing points of the replacement mirror are reworked (48) on the basis of ascertained differences between, firstly, the position- and orientation data of the mirror for replacement and, secondly, the position- and orientation data of the replacement mirror. The reworked replacement mirror is installed (54). This yields a mirror replacement method, in which an adjustment outlay of the replacement mirror in the projection exposure apparatus is reduced.

14 Claims, 11 Drawing Sheets

(51) Int. Cl.
  *G02B 5/09*      (2006.01)
  *G02B 27/62*     (2006.01)

(56)           References Cited

U.S. PATENT DOCUMENTS 7,196,841  B2      3/2007   Melzer et al.
  10,514,608 B2 *   12/2019   Baier ................. G03F 7/70033
  2005/0111067 A1    5/2005   Seifert et al.
  2008/0013680 A1    1/2008   Singer et al.
  2011/0001947 A1    1/2011   Dinger et al.

FOREIGN PATENT DOCUMENTS

DE    10 2016 203 990 A1    9/2017
  EP           1225481 A2     7/2002
  WO         2017153165 A1    9/2017

OTHER PUBLICATIONS

German Office Action with English translation, Application DE 102018221128.0, dated Jul. 10, 2019, 11 pages.

* cited by examiner

METHOD FOR REPLACING A MIRROR IN A PROJECTION EXPOSURE APPARATUS, AND POSITION- AND ORIENTATION DATA MEASURING DEVICE FOR CARRYING OUT THE METHOD

CROSS REFERENCE TO RELATED APPLICATIONS

This is a Continuation of International Application PCT/EP2019/083811 which has an international filing date Dec. 5, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 221 128.0 filed on Dec. 6, 2018.

FIELD OF INVENTION

The invention relates to a method for replacing a mirror in a projection exposure apparatus. Further, the invention relates to a position- and orientation data measuring device for carrying out such a method.

BACKGROUND

The operation of a projection exposure apparatus for producing semiconductor components with micrometer structures and nanometer structures requires optical units that ensure a correspondingly high resolution. This high resolution can only be ensured if the optical component parts are aligned with respect to one another with a high positional accuracy. Therefore, the replacement of a mirror within a projection exposure apparatus requires extremely high positioning accuracy and has been linked heretofore to high adjustment outlay.

A position- and orientation data measuring device is known from DE 10 2012 209 412 A1. A system adjustment of illumination systems is described in DE 10 2016 203 990 A1.

SUMMARY

It is an object of the present invention to develop a mirror replacement method of the type set forth at the outset such that an adjustment outlay of the replacement mirror in the projection exposure apparatus is reduced.

According to one formulation of the invention, this object is achieved by a method for replacing a mirror in a projection exposure apparatus, comprising:
measuring position- and orientation data of a replacement mirror to be inserted in place of the mirror for replacement, using a position- and orientation data measuring device,
reworking bearing points of the replacement mirror based on ascertained differences between, firstly, position- and orientation data of the mirror for replacement and, secondly, the position- and orientation data of the replacement mirror, and
installing the reworked replacement mirror as a substitute for the mirror for replacement.

Angle- and position data of an optical surface can be measured relative to mechanical references using the position- and orientation measuring device. The position- and orientation data may contain all six rigid body degrees of freedom, i.e., the three degrees of freedom of translation and the three degrees of freedom of rotation. If an orientation and position of an optical surface of the mirror is known relative to the bearing points and if the positions, or positions and orientations, of the bearing points of a mirror for replacement are known, it is sufficient, in principle, to exactly reproduce the positions, or positions and orientations, of these bearing points on the replacement mirror. Provided this bearing point positioning is perfect and implemented without a residual error, a mirror surface of the replacement mirror, following the installation of the replacement mirror, is ensured to be positioned at exactly the same location as the mirror surface of the originally installed mirror for replacement, and no further adjustments are necessary. In other cases, an adjustment outlay can be significantly reduced in comparison with a replacement method without measuring and reworking bearing points of the replacement mirror.

Depending on the configuration of the replacement method, a measurement by the position- and orientation data measuring device of position- and orientation data of the mirror for replacement, said measurement following a removal of the mirror for replacement, can be implemented as constituent part of the replacement method. Alternatively, it is possible to use position- and orientation data of the removed mirror for replacement, said data having been measured in advance.

The position- and orientation data of the replacement mirror can also be measured prior to the position- and orientation data of the mirror for replacement. In order to measure the position- and orientation data, use can be made of a position- and orientation data measuring device as is already known, in principle, from DE 10 2012 209 412 A1.

According to one embodiment, said measuring of the position- and orientation data of, firstly, the mirror for replacement and, secondly, the replacement mirror is implemented one directly in succession to the other. Measuring the position- and orientation data in this manner avoids problems with drift. Here, a sequence of the measurement is not necessarily important.

Absolute position- and orientation data measurement accuracy need not be achieved; instead, it is sufficient to obtain a high relative measurement accuracy between the measurement of the mirror for replacement and the measurement of the replacement mirror.

Measuring the position- and orientation data of, firstly, the mirror for replacement and, secondly, the replacement mirror, can be implemented within a day, can be implemented within 12 hours and, in particular, can be implemented within a shorter period of time, for example within two hours or within one hour.

According to a further embodiment, said measuring of the position- and orientation data of, firstly, the mirror for replacement and, secondly, the replacement mirror is implemented at one and the same location. Measuring the position- and orientation data at the same location avoids position- and orientation data errors that may arise on account of an overall displacement of the position- and orientation data measuring device.

According to further embodiments, at least one spacer is inserted during said reworking of the bearing points of the replacement mirror, and/or at least one instance of material ablation is implemented during said reworking of the bearing points of the replacement mirror. Reworking the bearing points was found to be particularly suitable. As an alternative or in addition thereto, there can also be a plastic deformation of the bearing points during the reworking.

According to another embodiment, the mirror for replacement is a facet mirror, and the facet mirror comprises a multiplicity of individual facets. When replacing a facet mirror, the advantages of the replacement method come into effect particularly well. The facet mirror can be a pupil facet mirror or a field facet mirror of an illumination optical unit of the projection exposure apparatus. Alternatively, the mirror for replacement may also be any other mirror of the illumination optical unit, a collector disposed directly downstream of an illumination light source or else a mirror of the projection optical unit of the projection exposure apparatus for imaging a reticle-side object field into a wafer-side image field.

According to yet another embodiment, an illumination beam path within the projection exposure apparatus is reproduced for said measuring of the position- and orientation data. Reproducing an illumination beam path leads to a particularly sensitive position- and orientation data measurement. When reproducing the illumination beam path, a beam direction and/or a beam diameter and/or a beam divergence of measurement light can be reproduced according to the corresponding parameters of the illumination light such that these parameters correspond to one another within predetermined tolerances. The beam direction of a reproduced measurement light beam path can run counter to that of the illumination beam path.

According to a further embodiment, a subset of illumination channels associated with the individual facets is considered (detected) during said measuring of the position- and orientation data. Considering an illumination channel subset simplifies the position- and orientation data measuring steps. When measuring the position- and orientation data, a global tilt of the individual channels, i.e., a mean value of a tilt of the individual channels, can be measured.

According to another embodiment, the subset corresponds to an illumination setting of the projection exposure apparatus. Selecting the subset leads to the possibility of a position- and orientation data measurement during the replacement method, which is adapted to the practical use of the mirror for replacement during the operation of the projection exposure apparatus.

According to yet another embodiment, stopping down the illumination channels not to be measured facilitates a simple subset selection.

According to a further embodiment, a position- and orientation data measuring device configured for the invention comprises:
a light source for measurement light,
a mirror holder for a mirror to be measured,
a measurement light detection unit in the beam path of the measurement light downstream of the mirror holder,
a stop for stopping-down the measurement light used for the measurement, and
an imaging optical unit for imaging the stop onto an arrangement plane of the mirror holder
The advantages of such a position- and orientation data measuring device correspond to those that have already been explained above with reference to the replacement method according to the invention.

For the position- and orientation data measuring device, use can be made, in principle, of that according to DE 10 2012 209 412 A1, following the adaptation to the necessity of measuring both the mirror for replacement and the replacement mirror.

According to a further aspect of the invention, a position- and orientation data measuring device for measuring the position- and orientation data of a mirror comprising a multiplicity of individual facets, comprises:
a light source for measurement light,
a mirror holder for the mirror to be measured,
a measurement light detection unit in the beam path of the measurement light downstream of the mirror holder,
wherein the position- and orientation data measuring device is embodied such that a subset of illumination channels associated with the individual facets is detected when measuring the position- and orientation data of the mirror,
a stop for stopping-down the measurement light used for the measurement, and
an imaging optical unit for imaging the stop onto an arrangement plane of the mirror holder.

In principle, the advantages of such a position- and orientation data measuring device correspond to those which were already explained above in conjunction with the methods associated with mirrors having individual facets. On account of the reduction of the detected illumination channels to a subset, there is a corresponding simplification of the measurement process to be carried out using the position- and orientation data measuring device. The ascertainment of a multiplicity of position- and orientation data that, in principle, are redundant can be avoided.

The position- and orientation data measuring device has an imaging optical unit for imaging the stop onto an arrangement plane of the mirror holder. Such an imaging optical unit facilitates the selection of very specific portions of a measurement light beam cross section that is possible overall.

According to yet another embodiment, the stop is disposed between the light source and the mirror holder and close to the mirror holder. Such arrangements of the stop facilitate simple stopping-down of non-required components of a measurement light beam.

By way of a corresponding stop configuration, it is possible, in particular, to select a subset selection of illumination channels to be measured, which corresponds to an illumination setting of a projection exposure apparatus in which the mirror to be measured is used. Then, the position- and orientation data measuring device is well adapted to the practical use of the mirror to be measured, during operation within the projection exposure apparatus.

The component to be produced by the projection exposure apparatus can be a microchip and, for example, a memory chip.

BRIEF DESCRIPTION OF THE DRAWINGS

Exemplary embodiments of the invention are explained in greater detail below with reference to the drawing. In said drawings.

DETAILED DESCRIPTION

Figure 1:
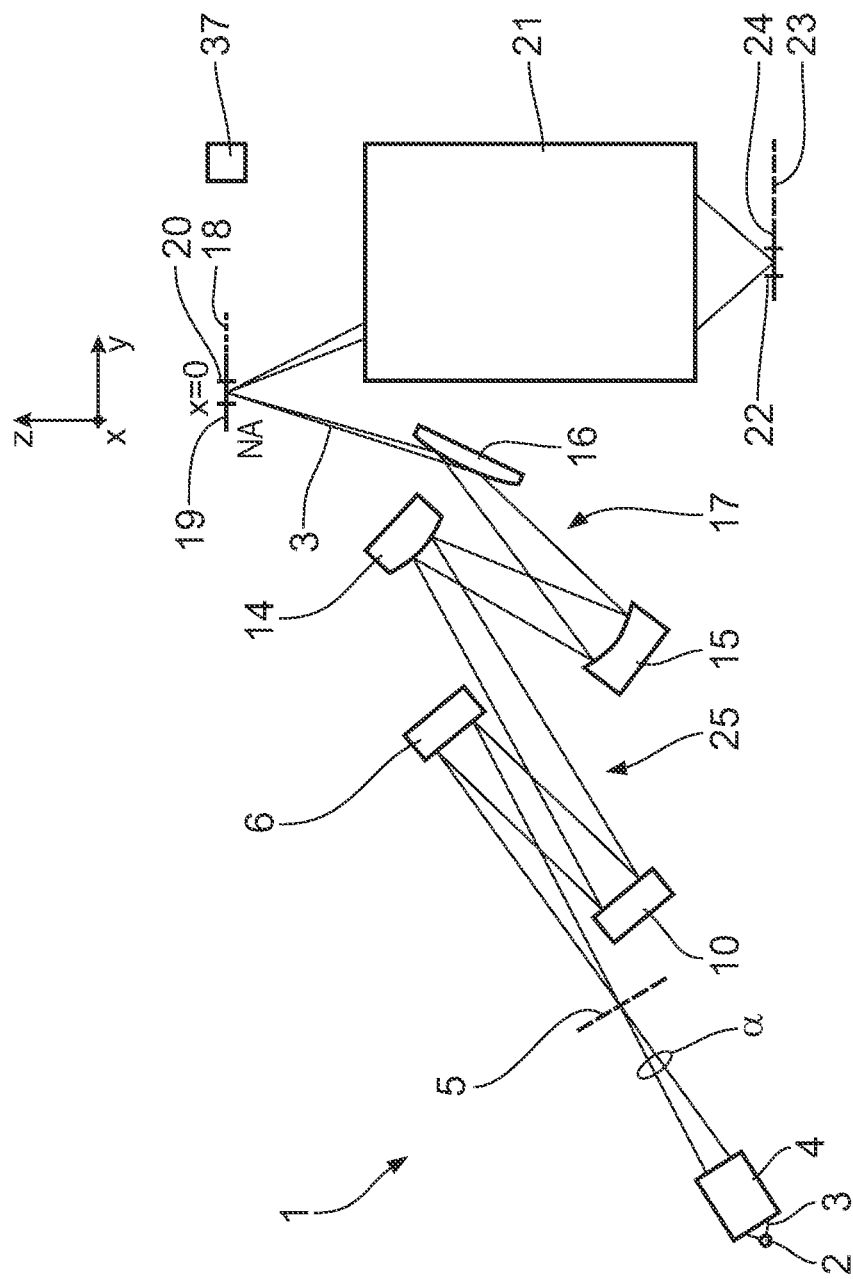
FIG. 1 shows a microlithographic projection exposure apparatus schematically and with respect to an illumination optical unit in a meridional section.

A microlithographic projection exposure apparatus 1 serves for producing a microstructured or nanostructured electronic semiconductor component. A light source 2 emits extreme ultraviolet (EUV) radiation used for illumination in the wavelength range of, for example, between 5 nm and 30 nm. The light source 2 can be a GDPP (gas discharge produced plasma) source or an LPP (laser produced plasma) source. A radiation source based on a synchrotron can also be used for the light source 2. Information about such a light source can be found by a person skilled in the art in U.S. Pat. No. 6,859,515 B2, for example. EUV illumination light or illumination radiation 3 is used for illumination and imaging within the projection exposure apparatus 1. The EUV illumination light 3 downstream of the light source 2 firstly passes through a collector 4, which can be, for example, a nested collector having a multi-shell construction known from the prior art, or alternatively an ellipsoidally shaped collector. A corresponding collector is known from EP 1 225 481 A2. Downstream of the collector 4, the EUV illumination light 3 firstly passes through an intermediate focal plane 5, which can be used for separating the EUV illumination light 3 from unwanted radiation or particle portions. After passing through the intermediate focal plane 5, the EUV illumination light 3 firstly strikes a field facet mirror 6. An overall beam of the illumination light 3 has a numerical aperture a in the intermediate focal plane 5.

In principle, light with a longer wavelength, e.g., deep ultraviolet (DUV) light with a wavelength of 193 nm, can also be used as the illumination light 3.

In order to facilitate the description of positional relationships, a Cartesian global xyz-coordinate system is in each case depicted in the drawing. In FIG. 1, the x-axis runs perpendicularly to and out of the plane of the drawing. The y-axis runs toward the right in FIG. 1. The z-axis runs upward in FIG. 1.

In order to facilitate the description of positional relationships for individual optical component parts of the projection exposure apparatus 1, a Cartesian local xyz- or xy-coordinate system is in each case also used in the following figures. The respective local xy-coordinates span, unless described otherwise, a respective principal arrangement plane of the optical component part, for example a reflection plane. The x-axes of the global xyz-coordinate system and of the local xyz- or xy-coordinate systems run parallel to one another. The respective y-axes of the local xyz- or xy-coordinate systems are at an angle with respect to the y-axis of the global xyz-coordinate system which corresponds to a tilting angle of the respective optical component part about the x-axis.

Figure 2:
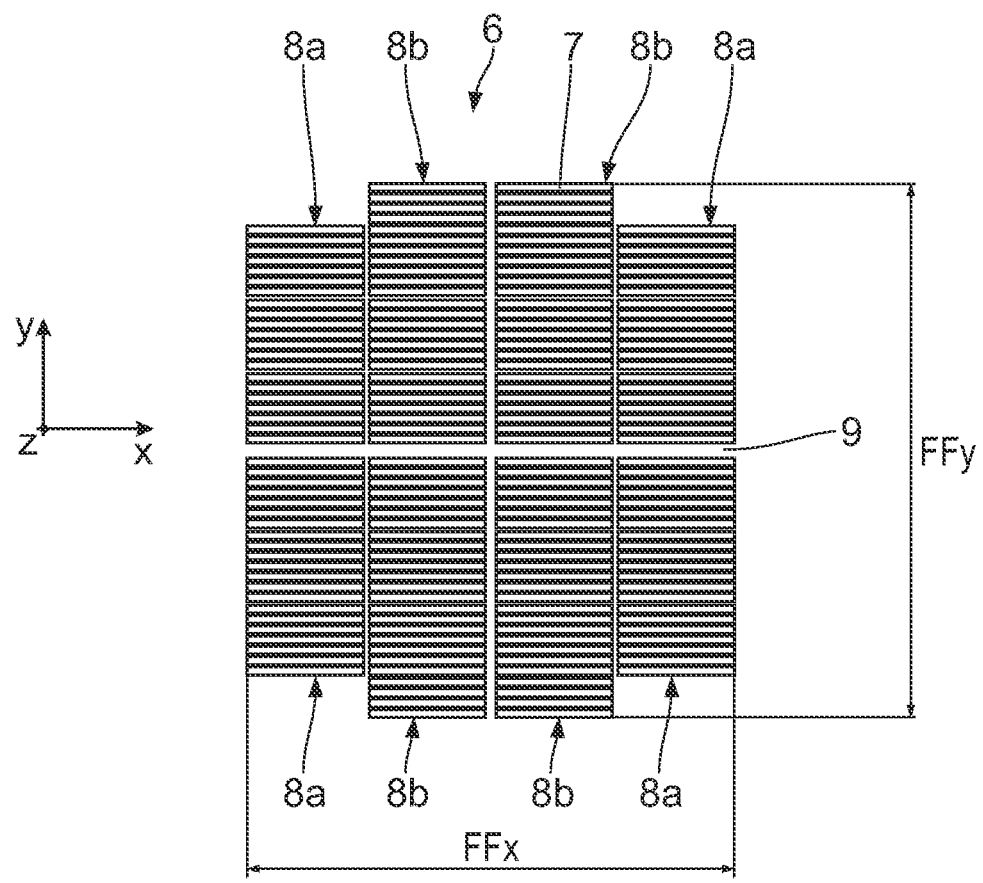
FIG. 2 shows a plan view on a facet arrangement of a field facet mirror of the illumination optical unit of the projection exposure apparatus according to FIG. 1.

FIG. 2 shows, in an exemplary manner, a facet arrangement of field facets 7 of the field facet mirror 6. The field facets 7 are rectangular and have in each case the same x/y aspect ratio. The x/y aspect ratio can be for example 12/5, can be 25/4 or can be 104/8.

The field facets 7 predetermine a reflection surface of the field facet mirror 6 and are grouped into four columns with 6 to 8 field facet groups 8a, 8b each. The field facet groups 8a respectively have seven field facets 7. The two additional field facet groups 8b, on the edge, of the two central field facet columns respectively have four field facets 7. The facet arrangement of the field facet mirror 6 has interstices 9, in which the field facet mirror 6 is shadowed by holding spokes of the collector 4, between the two central facet columns and between the third facet line and the fourth facet line.

In a variant not illustrated here, the field facet mirror 6 is constructed as an MEMS mirror array with a multiplicity of tiltable individual mirrors, with each of the field facets 7 being formed by a plurality of such individual mirrors. Such a construction of the field facet mirror 6 is known from US 2011/0001947 A1.

After reflection at the field facet mirror 6, the EUV illumination light 3 split into pencils of rays or partial beams assigned to the individual field facets 7 strikes a pupil facet mirror 10.

The field facets 7 of the field facet mirror 6 are tiltable between a plurality of illumination tilt positions, and so this alters the direction of a beam path of the illumination light 3 reflected by the respective field facet 7 and hence is able to alter the point of incidence of the reflected illumination light 3 on the pupil facet mirror 10. Corresponding field facets that are displaceable between various illumination tilt positions are known from U.S. Pat. No. 6,658,084 B2 and U.S. Pat. No. 7,196,841 B2. This facilitates the prescription of an illumination setting, i.e., a distribution of illumination angles for illuminating the object field. Examples of illumination settings are known, inter alia, from DE 10 2008 021 833 A1.

Figure 3:
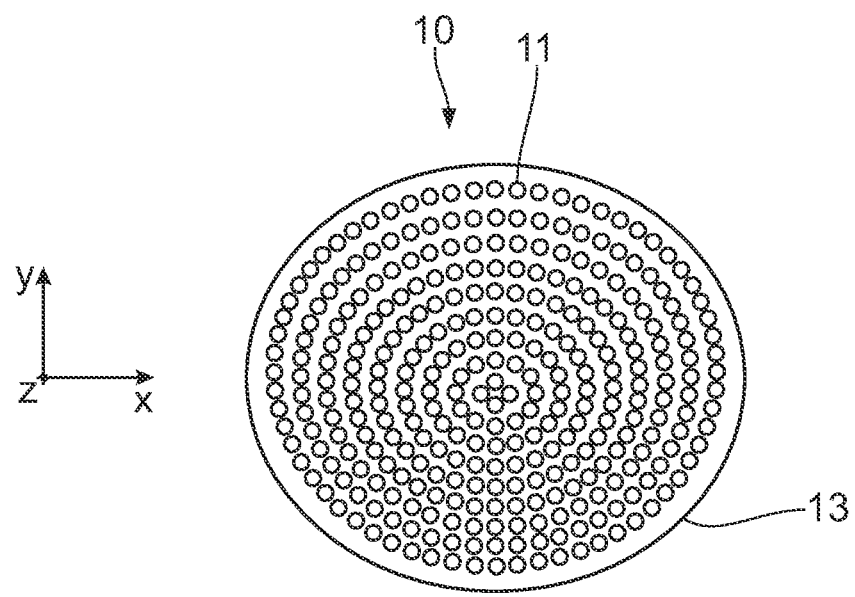
FIG. 3 shows a plan view on a facet arrangement of a pupil facet mirror of the illumination optical unit of the projection exposure apparatus according to FIG. 1.

FIG. 3 shows an exemplary facet arrangement of round pupil facets 11 on a pupil facet carrier 13 of the pupil facet mirror 10. The pupil facets 11 are disposed around a center in facet rings lying one inside another. At least one pupil facet 11 is assigned to each partial beam of the EUV illumination light 3 reflected by one of the field facets 7, such that a respective impinged facet pair comprising one of the field facets 7 and one of the pupil facets 11 predefines an object field illumination channel for the associated partial beam of the EUV illumination light 3. The channel-by-channel assignment of the pupil facets 11 to the field facets 7 is implemented on the basis of a desired illumination by the projection exposure apparatus 1.

Below, the pupil facet mirror 10 is also referred to as mirror for measurement. Below, the pupil facets 11 are also referred to as individual facets.

The field facet mirror 6 comprises several hundred of the field facets 7, for example 300 field facets 7. The number of pupil facets 11 of the pupil facet mirror 10 can at least equal the sum of the tilt positions of all field facets 7 of the field facet mirror 6.

In a variant not illustrated here, the pupil facet mirror 10 is constructed as an MEMS mirror array with a multiplicity of tiltable individual mirrors, with each of the pupil facets 11 being formed by a plurality of such individual mirrors. Such a construction of the pupil facet mirror 10 is known from US 2011/0001947 A1.

Via the pupil facet mirror 10 (cf., FIG. 1) and a downstream transfer optical unit 17 consisting of three EUV mirrors 14, 15, 16, the field facets 7 are imaged into an object plane 18 of the projection exposure apparatus 1. The EUV mirror 16 is embodied as a mirror for grazing incidence (grazing incidence mirror). Disposed in the object plane 18 is an object in the form of a reticle 19, from which, with the EUV illumination light 3, an illumination region in the form of an illumination field is illuminated, said illumination field coinciding with an object field 20 of a downstream projection optical unit 21 of the projection exposure apparatus 1. The object field illumination channels are superimposed in the object field 20. The EUV illumination light 3 is reflected from the reticle 19.

An overall beam of the illumination light 3 at the object field 20 has an object-side numerical aperture NA, which may lie in the range between 0.04 and 0.15, for example.

The projection optical unit 21 images the object field 20 in the object plane 18 into an image field 22 in an image plane 23. Disposed in said image plane 23 is a wafer 24 bearing a light-sensitive layer, which is exposed during the projection exposure with the projection exposure apparatus 1. During the projection exposure, both the reticle 19 and the wafer 24 are scanned in a synchronized manner in the y-direction. The projection exposure apparatus 1 is embodied as a scanner. Below, the scanning direction y is also referred to as object displacement direction.

The field facet mirror 6, the pupil facet mirror 10 and the mirrors 14 to 16 of the transfer optical unit 17 are parts of an illumination optical unit 25 of the projection exposure apparatus 1. In a variant of the illumination optical unit 25 not illustrated in FIG. 1, the transfer optical unit 17 may also be dispensed with in part or in full, and so no further EUV mirror, exactly one further EUV mirror or else exactly two further UV mirrors may be disposed between the pupil facet mirror 10 and the object field 20. The pupil facet mirror 10 can be disposed in an entry pupil plane of the projection optical unit 21.

Together with the projection optical unit 21, the illumination optical unit 25 forms an optical system of the projection exposure apparatus 1.

The field facet mirror 6 represents a first facet mirror of the illumination optical unit 25. The field facets 7 represent first facets of the illumination optical unit 25.

The pupil facet mirror 10 represents a second facet mirror of the illumination optical unit 25. The pupil facets 11 represent second facets of the illumination optical unit 25.

Figure 4:
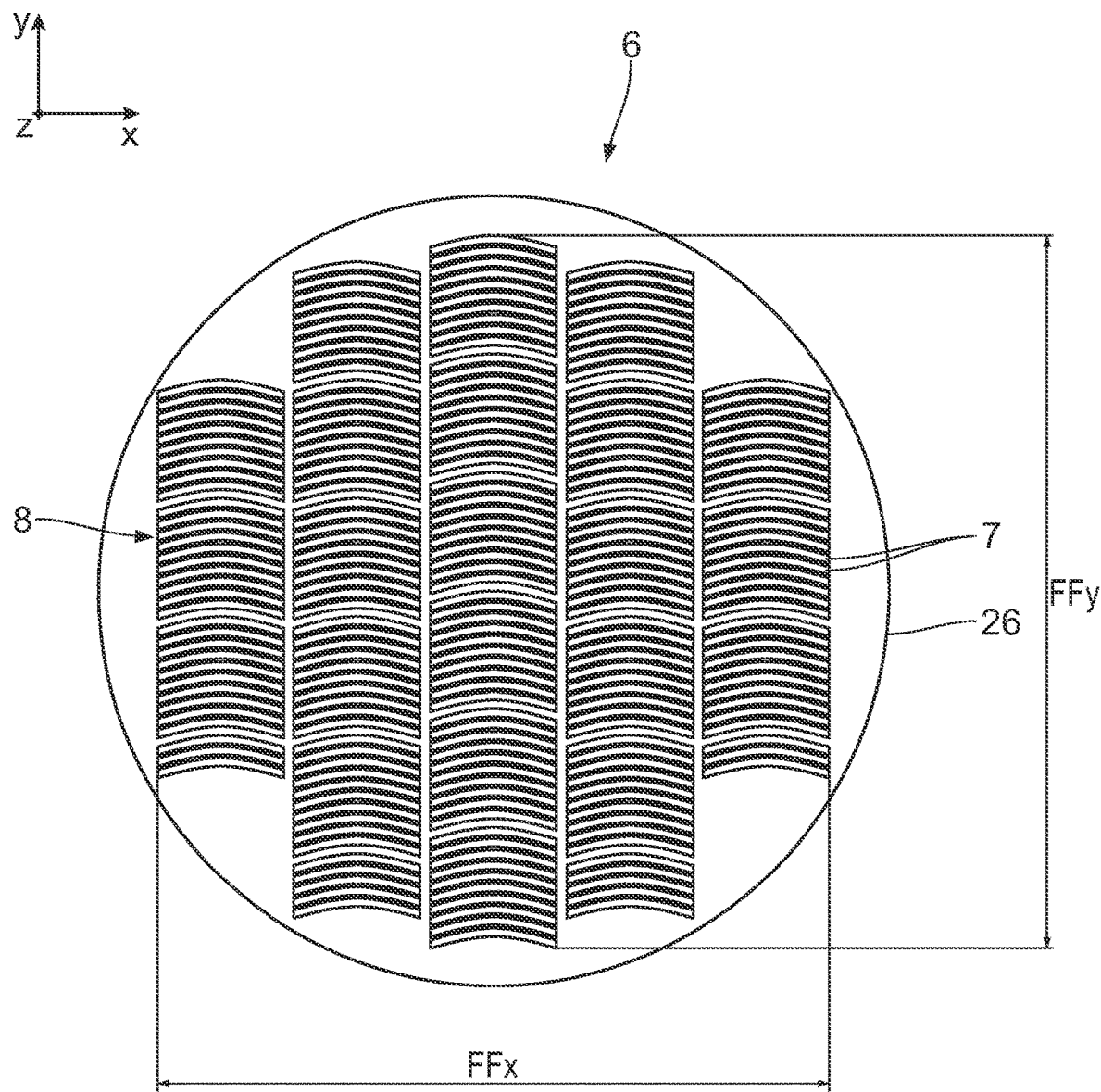
FIG. 4 shows, in an illustration similar to FIG. 2, a facet arrangement of a further embodiment of a field facet mirror.

FIG. 4 shows a further embodiment of a field facet mirror 6. Component parts that correspond to those that were explained above with reference to the field facet mirror 6 according to FIG. 2 have the same reference signs and are only explained to the extent that these differ from the component parts of the field facet mirror 6 according to FIG. 2. The field facet mirror 6 according to FIG. 4 comprises a field facet arrangement with arcuate field facets 7. These field facets 7 are disposed in a total of five columns with, in each case, a plurality of field facet groups 8. The field facet arrangement is inscribed in a circular boundary of a carrier plate 26 of the field facet mirror 6.

The totality of the field facets 7 are housed on the respective carrier plate 26 of the field facet mirror 6 within an area with dimensions FFx, FFy.

The field facets 7 in the embodiment according to FIG. 4 all have the same area and the same ratio of width in the x-direction and height in the y-direction, which corresponds to the x/y-aspect ratio of the field facets 7 of the embodiment according to FIG. 2.

Figure 5:
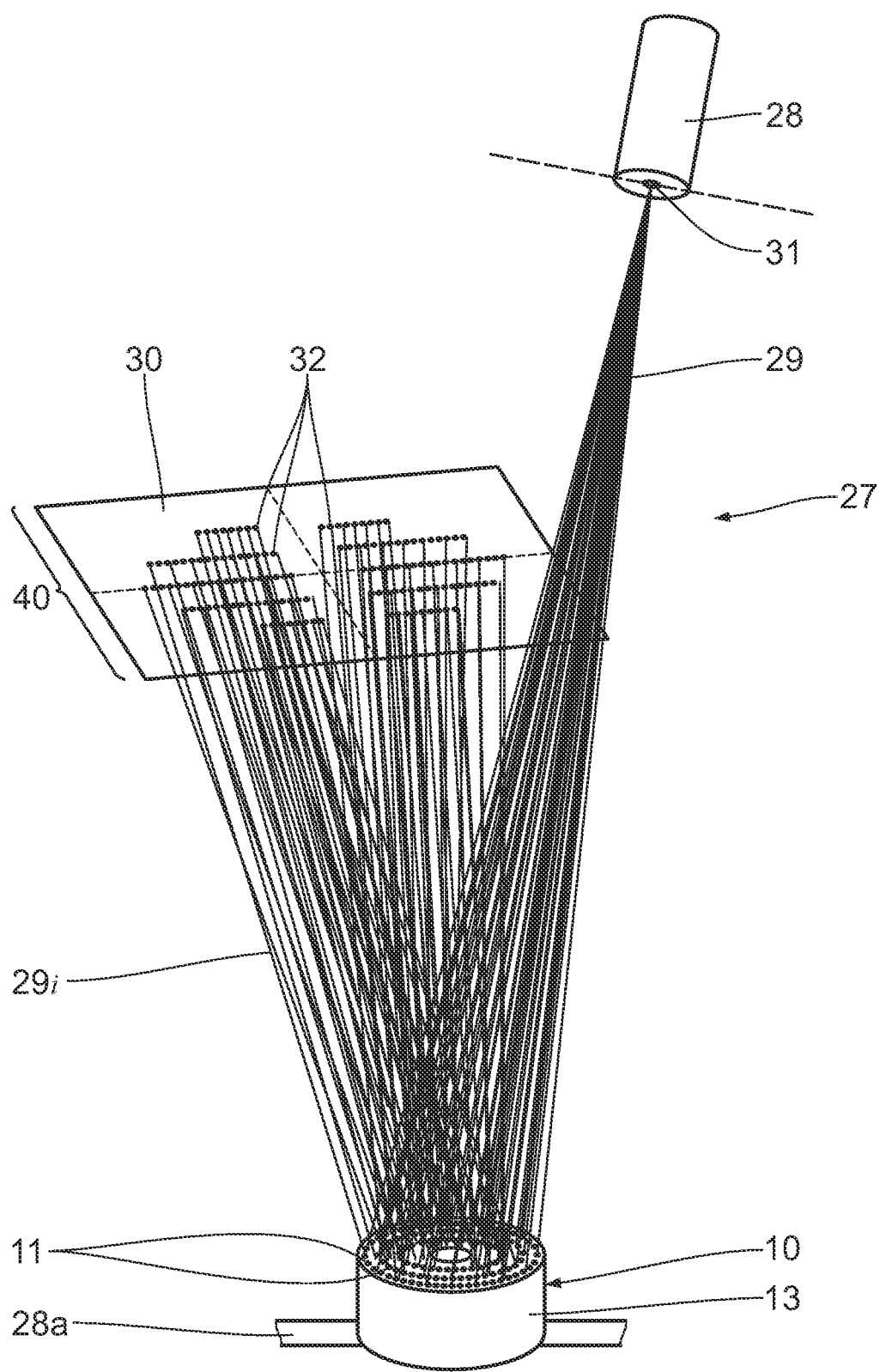
FIG. 5 schematically shows a position- and orientation data measuring device for measuring the position- and orientation data of a facet mirror for replacement in a projection exposure apparatus.

FIG. 5 shows an embodiment of a position- and orientation data measuring device 27 for measuring the position- and orientation data of a mirror and, in particular, of a facet mirror using the example of the pupil facet mirror 10. The position- and orientation data measuring device 27 is used in a method for replacing a mirror in the projection exposure apparatus 1, as is yet to be described below. The mirror for replacement can be the pupil facet mirror 10, the field facet mirror 6 or, in principle, any other mirror, guiding the illumination light 3, of the projection exposure apparatus 1 between the light source 2 and the wafer 24.

The basic structure of such a position- and orientation data measuring device is known from DE 10 2012 209 412 A1.

The position- and orientation data measuring device 27 comprises a light source 28 for measurement light 29. The measurement light can be light with the wavelength of the illumination light 3 or light with a different wavelength, for example in the DUV-, UV- or VIS range. The measurement-light light source 28 can be configured as an LED.

The mirror for measurement is held with a precise position and orientation in a mirror holder 28a, which is only illustrated schematically and in sections in FIG. 5.

Proceeding from the measurement-light light source 28, a beam path of the measurement light 29 is modelled in respect of its beam direction, beam diameter and beam divergence such that it corresponds to a beam path of the illumination light 3 downstream of the pupil facet mirror 10 within the illumination optical unit 25. Particularly in the region of the reflection of the measurement light 29 at the pupil facet mirror 10 for measurement, the measurement light beam path then corresponds to the illumination light beam path in the illumination optical unit 25, with the measurement light beam path having the opposite direction to the illumination light beam path.

Measurement light partial beams $29_i$ of the measurement light 29 correspond to the illumination channels of the illumination optical unit 25.

Following the reflection at the pupil facets 11 of the pupil facet mirror 10 for measurement, the reflected measurement light partial beams 29$_i$ propagate towards a measurement plane 30, which corresponds to an arrangement plane of the field facet mirror 6. The measurement plane 30 can be understood to be an image plane of an output spot 31 of the measurement-light light source 28. When comparing the measurement light beam path according to FIG. 5 with the measurement light beam path according to FIG. 1, the measurement plane 30 corresponds to the arrangement plane of the field facet mirror 6, i.e., a field plane of the illumination light beam path, and the position and orientation of the output spot 31 corresponds to the object plane 18.

An arrangement of the individual measurement light partial beams 29$_i$, as measurement light spots 32 assigned to the individual pupil facets 11, arises in the measurement plane 30. The arrangement distribution of said measurement light spots corresponds to the distribution of the field facets 7 on the field facet mirror 6. A deviation of an actual distribution of the measurement light spots 32 from a target distribution, specifically the predetermined field facet arrangement within the illumination optical unit 25, is converted by the position- and orientation measuring device 27 into a position- and orientation data difference between actual position- and orientation data of the pupil facet mirror 10 for measurement and target position- and orientation data, which should be obtained in the case of correct positioning of the mirror for measurement.

The position- and orientation data measuring device 27 can be embodied such that it contains no moving component parts.

The component parts of the position- and orientation data measuring device 27, more particularly the measurement-light light source 28, the mirror holder 28a and a measurement light detection unit 40 disposed in the measurement plane 30 are carried by a common support frame of the position- and orientation data measuring device 27. This common support frame is not illustrated per se in the drawing.

The measurement light detection unit 40 comprises a spatially resolving detector, for example a CCD or CMOS detector, with which it is possible to ascertain an exact position of the measurement light spots 32 in the measurement plane 30.

When measuring the position- and orientation data of the mirror for measurement, it is not necessary to consider all illumination channels, i.e., all beam paths of the measurement light partial beams 29$_i$, assigned to all pupil facets 11. It suffices to consider a subset of such illumination channels, said subset corresponding to an illumination setting in fact used when operating the projection exposure apparatus 1, for example. By way of example, this subset thus can be those pupil facets 11 that are illuminated in the case of an annular illumination setting, a dipole illumination setting or a multi-pole illumination setting. In an extreme case, it is possible to measure only very few individual facets, for example fewer than 10 or fewer than 5 of such individual facets, for example merely one, two or three individual facets.

Figure 6:
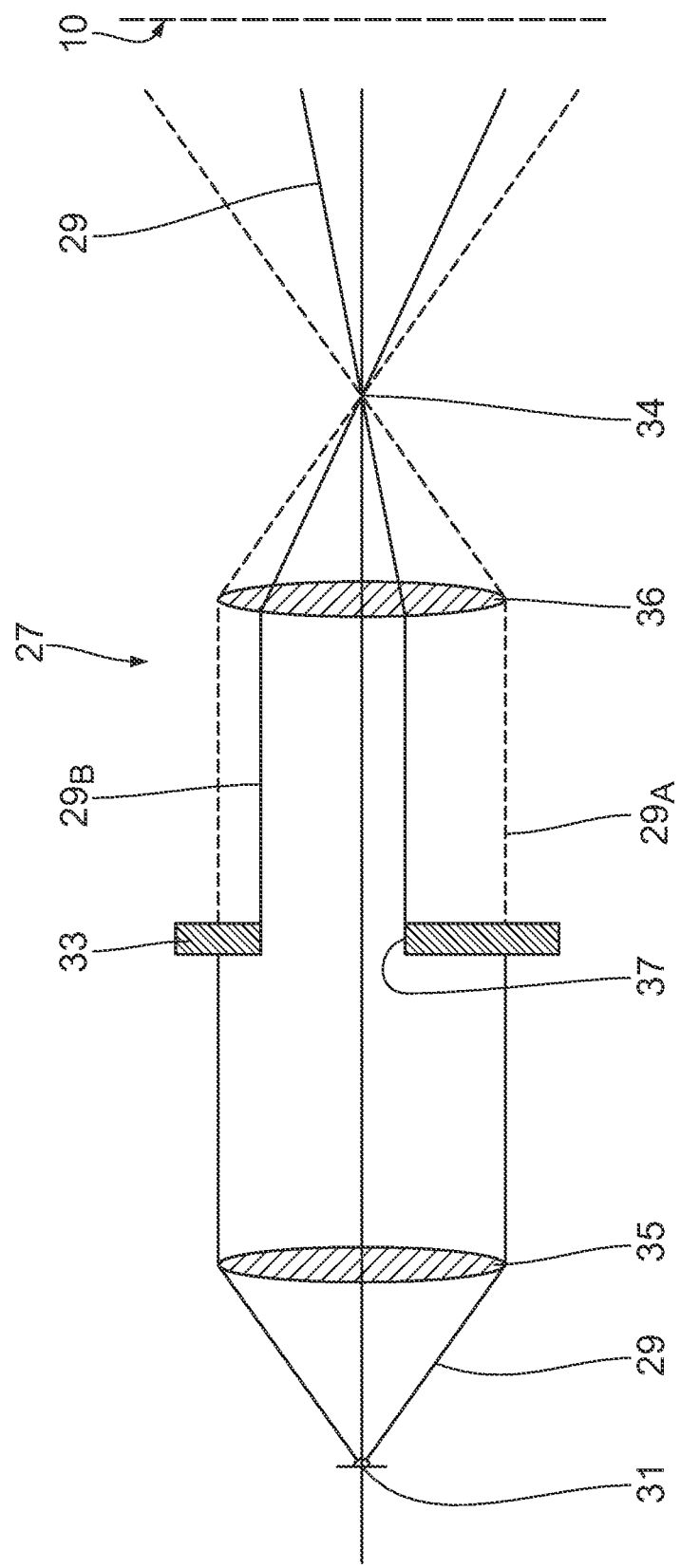
FIG. 6 shows a measurement light beam path of an embodiment of the position- and orientation data measuring device between a light source and the facet mirror to be measured, wherein a first embodiment of a stop for stopping down facet illumination channels that should not be measured is disposed in the beam path.

FIG. 6 shows a measurement light beam path of an embodiment of the position- and orientation data measuring device 27 with a variant of such a stop 33 for selecting such an illumination channel subset. Component parts and functions corresponding to those which have already been explained above with reference to FIGS. 1 and 5, and in particular with reference to FIG. 5, are denoted by the same reference signs and are not discussed in detail again.

FIG. 6 illustrates a measurement light beam path between the output spot 31 of the measurement light source 28 and an intermediate focus 34 upstream of the mirror 10 for measurement, which is disposed in the further measurement light beam path and indicated in FIG. 6 using dashed lines. After the output spot 31, the measurement light 29 initially passes through a condenser lens 35, with the aid of which the measurement light beam path is parallelized. The parallel measurement light beam then passes through the stop 33 and a measurement light portion 29$_B$, which has not been stopped down, then passes through a focusing lens element 36. The focusing lens element 36 ensures that a stop contour 37 is imaged onto the mirror 10 for measurement such that a subset of the pupil facets 11 lying within this stop contour 37 is impinged by the measurement light 29 there, and consequently the position- and orientation data measuring device 27 equipped thus considers a subset of illumination channels assigned to these impinged pupil facets 11. Using dashed lines, FIG. 6 illustrates a hypothetical marginal beam path 29A of the entire measurement light beam without stopping down in the measurement light beam path downstream of the stop 33.

Thus, the lens element 36 represents an imaging optical unit for imaging the stop 33 onto an arrangement plane of the mirror holder of the position- and orientation data measuring device 27.

Figure 7:
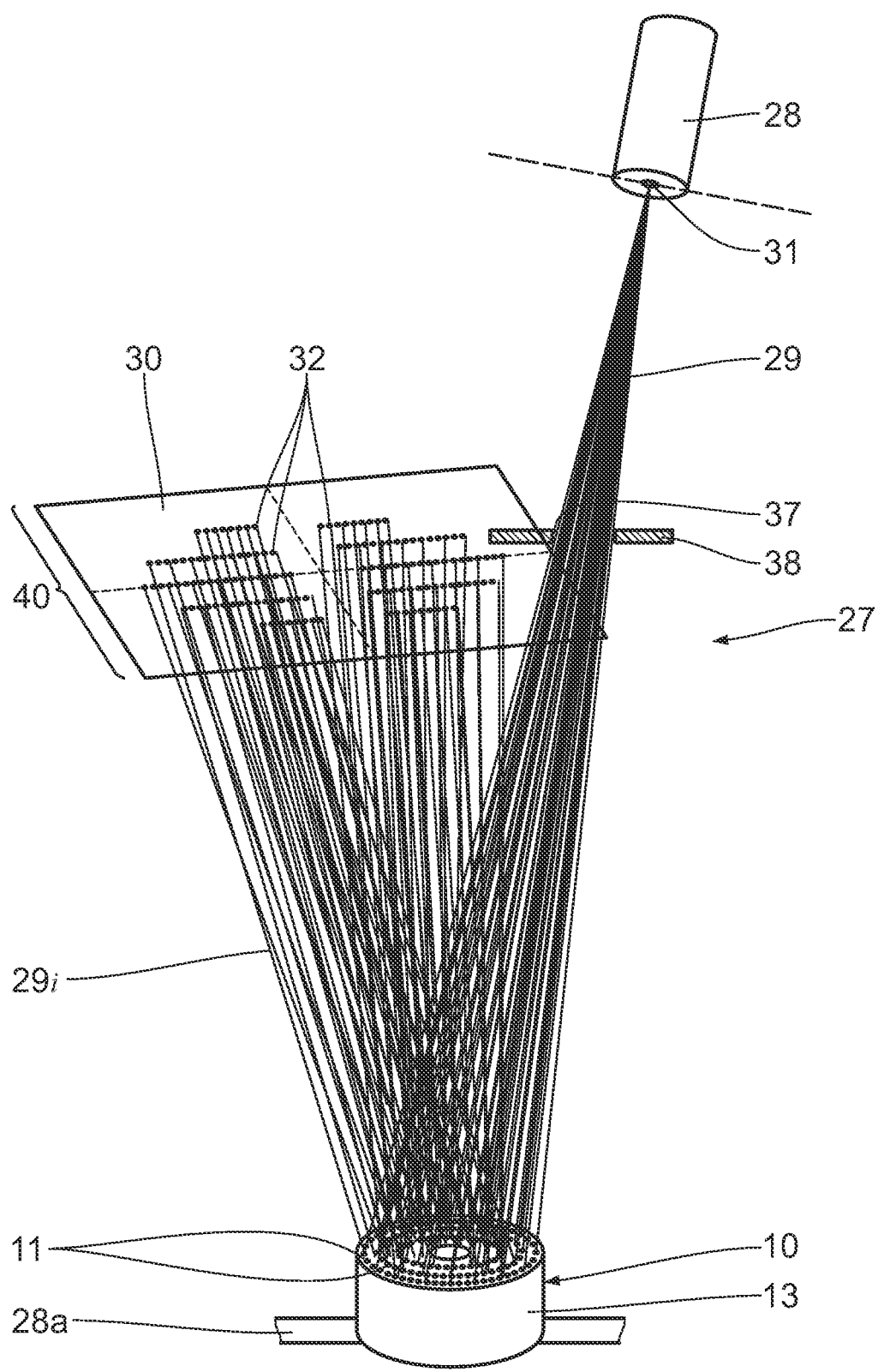
FIGS. 7 and 8 each show, in an illustration similar to FIG. 5, further arrangement variants of stops for stopping down facet illumination channels that should not be measured.

FIG. 7 shows a further embodiment of a stop 38 for selecting a subset of illumination channels assigned to the individual facets, corresponding to the measurement light partial beams 29$_i$. The function of the stop 38 corresponds to that of the stop 33 according to FIG. 6. Component parts and functions corresponding to those which have already been explained above with reference to FIGS. 1 to 6, and in particular with reference to FIGS. 5 and 6, are denoted by the same reference signs and are not discussed in detail again.

The stop 38 is disposed as a shadow-casting stop in the measurement light beam path between the output spot 31 and the mirror 10 for measurement.

The stop 38 directly stops down the measurement light beam before the mirror 10 for measurement is impinged.

Below, a further embodiment of a stop 39 for selecting a subset of illumination channels assigned to the individual facets is described on the basis of FIG. 8. Component parts and functions corresponding to those which were already explained above with reference to FIGS. 1 to 7, and in particular with reference to FIGS. 5 to 7, are denoted by the same reference signs and are not discussed in detail again.

Figure 8:
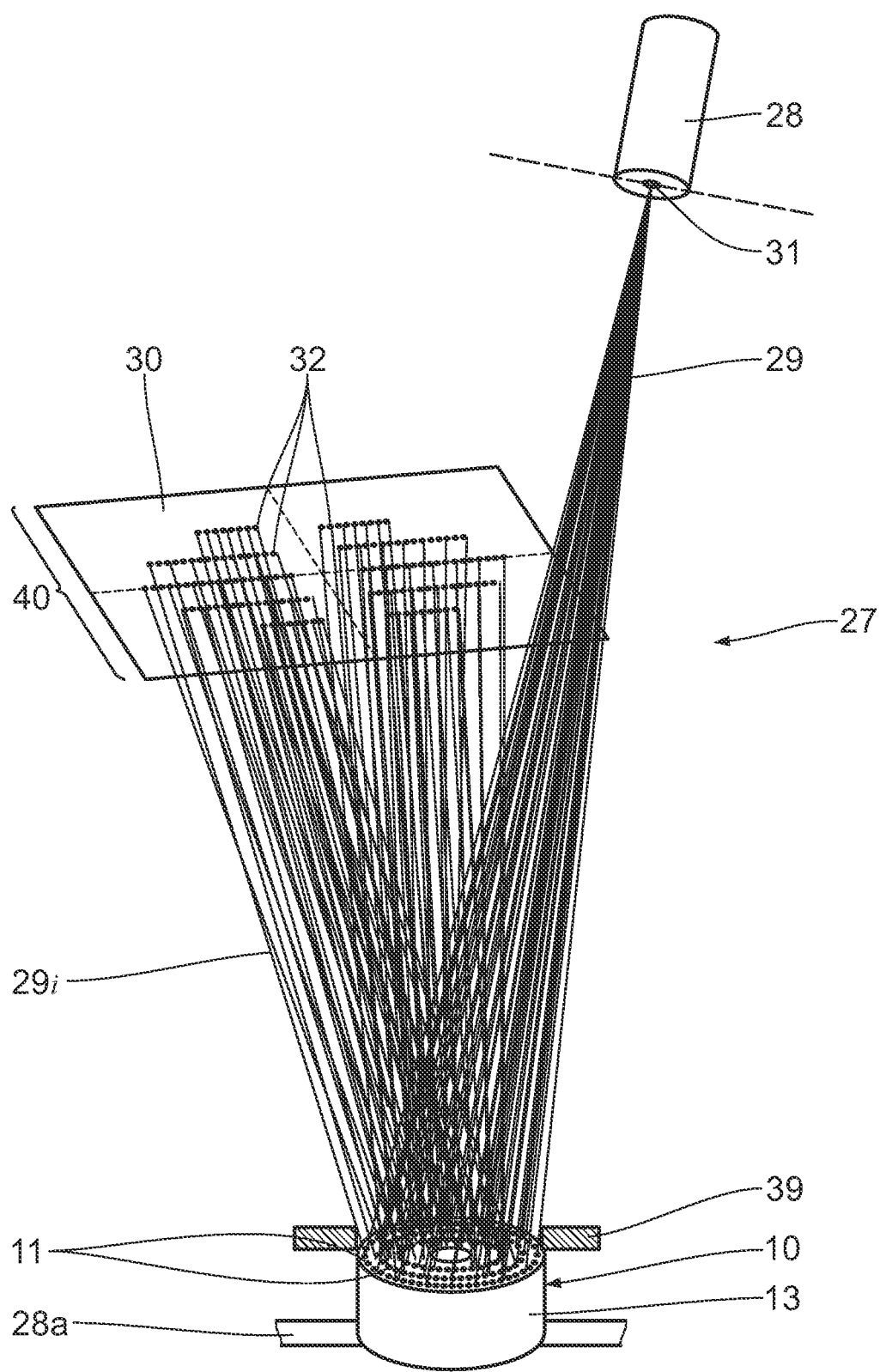
Figure 9:
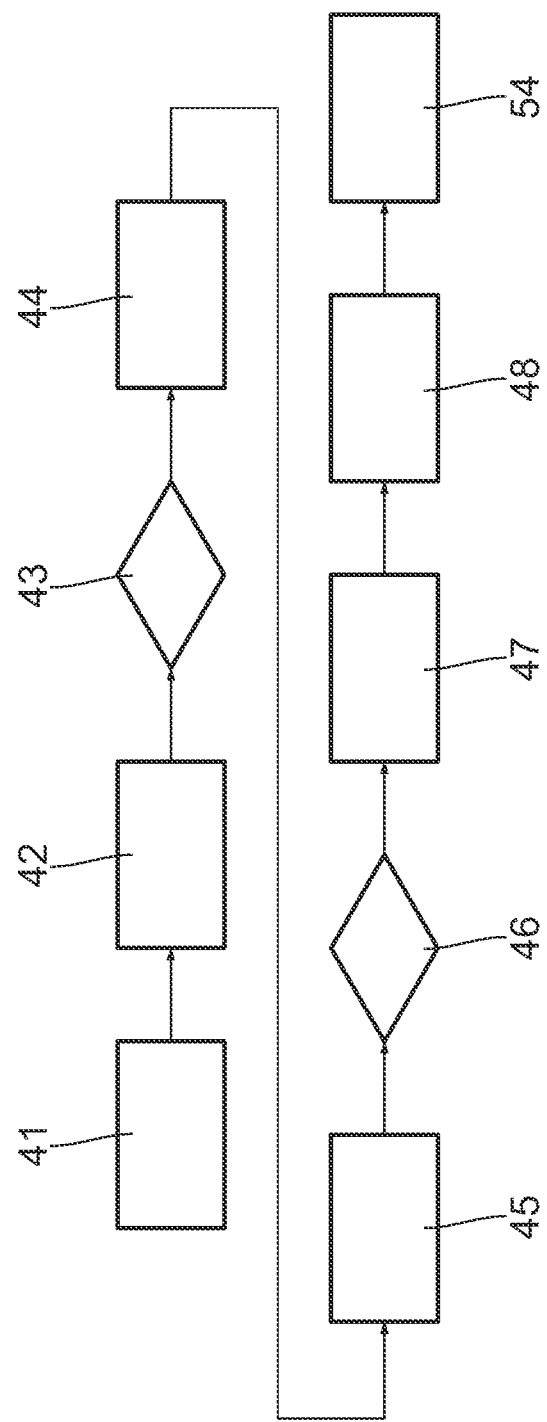
FIG. 9 shows a flowchart of a method for replacing a mirror in the projection exposure apparatus, containing a measurement of position- and orientation data of a mirror for replacement and of a replacement mirror, in each case with one of the variants of the position- and orientation data measuring device.

In the embodiment according to FIG. 8, the stop 39 is disposed in the region of the reflection of the measurement light 29 at the mirror 10 for measurement, the function of said stop corresponding to that of the stops 33 according to FIGS. 6 and 38 according to FIG. 7.

The stop 39 is embodied as a near field stop. The stop 39 is disposed in the vicinity of the mirror holder 28A.

A method for replacing a mirror in the projection exposure apparatus 1 using one of the above-described embodiments of the position- and orientation data measuring device 27 is explained below on the basis of FIGS. 9 to 17. Component parts and functions which were already described above on the basis of FIGS. 1 to 8 have the same reference signs and are not discussed again in detail.

A mirror for replacement, for example the pupil facet mirror 10, is initially removed from the projection exposure apparatus 1 during a removal step 41. In a subsequent installation step 42, the removed mirror for replacement is then installed in the mirror holder 28a of the position- and orientation data measuring device 27. Then, the position- and orientation data of the mirror for replacement are measured using the respective embodiment of the position- and orientation data measuring device 27 in a measurement step 43. Subsequently, the mirror for replacement is removed from the position- and orientation data measuring device 27 again in a further removal step 44. Now, the replacement mirror, intended to be installed in the projection exposure apparatus 1 as a replacement for the mirror for replacement, is installed in the mirror holder 28a of the position- and orientation data measuring device 27 in an installation step 45. Now, the position- and orientation data of the replacement mirror are measured by the position- and orientation data measuring device 27 in a subsequent measurement step 46. Then, the replacement mirror is removed from the position- and orientation data measuring device 27 again in a subsequent removal step 47.

Now, position- and orientation data differences between the measured position- and orientation data of the mirror for replacement and the measured position- and orientation data of the replacement mirror are calculated in a calculation step 48. Now, the bearing points of the replacement mirror are reworked on the basis of these position- and orientation data differences.

This is still elucidated in greater detail below with reference to FIG. 10ff.

Figure 10:
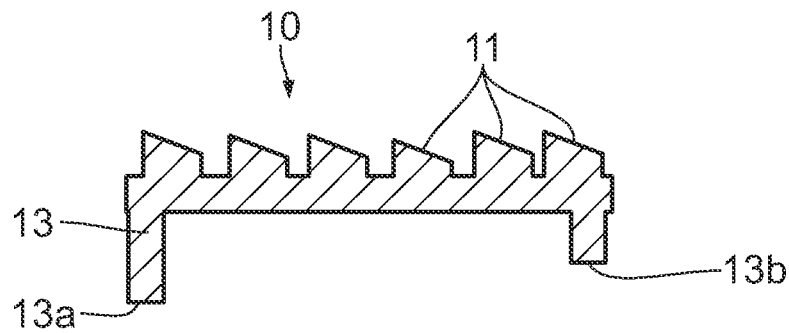
FIG. 10 schematically shows a side view of the facet mirror for replacement.
Figure 11:
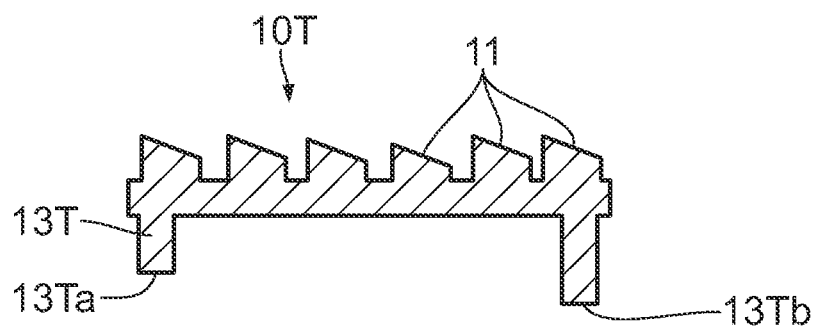
FIG. 11 shows the replacement mirror in a view similar to FIG. 10.

FIG. 10 schematically shows a side view of the mirror for replacement on the basis of a pupil facet mirror for replacement with pupil facets 11 and a pupil facet carrier 13 with bearing points 13a, 13b. In a corresponding illustration, FIG. 11 shows the replacement mirror in the form of another pupil facet mirror 10T, once again with pupil facets 11 and a pupil facet carrier 13T with bearing points 13Ta, 13Tb. Differences between the relative position of, firstly, the bearing points 13a, 13b and, secondly, the bearing points 13Ta, 13Tb relative to the entire mirror are illustrated with much exaggeration in FIGS. 10 and 11.

Figure 12:
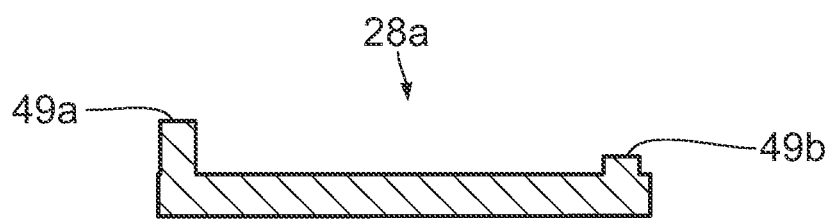
FIG. 12 shows, in a view similar to FIGS. 10 and 11, a measurement receptacle of the position- and orientation data measuring device for receiving the mirror for replacement or the replacement mirror.

FIG. 12 shows the mirror holder 28a of the position- and orientation data measuring device 27 with bearing receptacles 49a, 49b, which are assigned, firstly, to the bearing receptacles 13a, 13Ta and, secondly, 13b, 13Tb.

Figure 13:
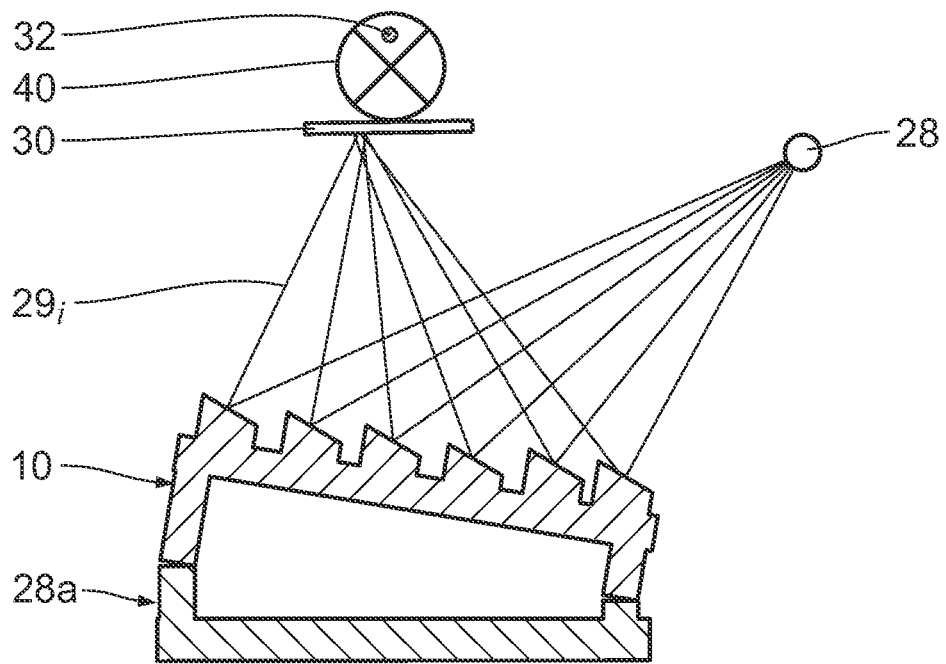
FIG. 13 schematically shows, in a view similar to FIGS. 10 to 12, a beam path in the position- and orientation data measuring device when measuring the mirror for replacement according to FIG. 10.

FIG. 13 shows the pupil facet mirror 10 for replacement during measurement step 43.

Figure 14:
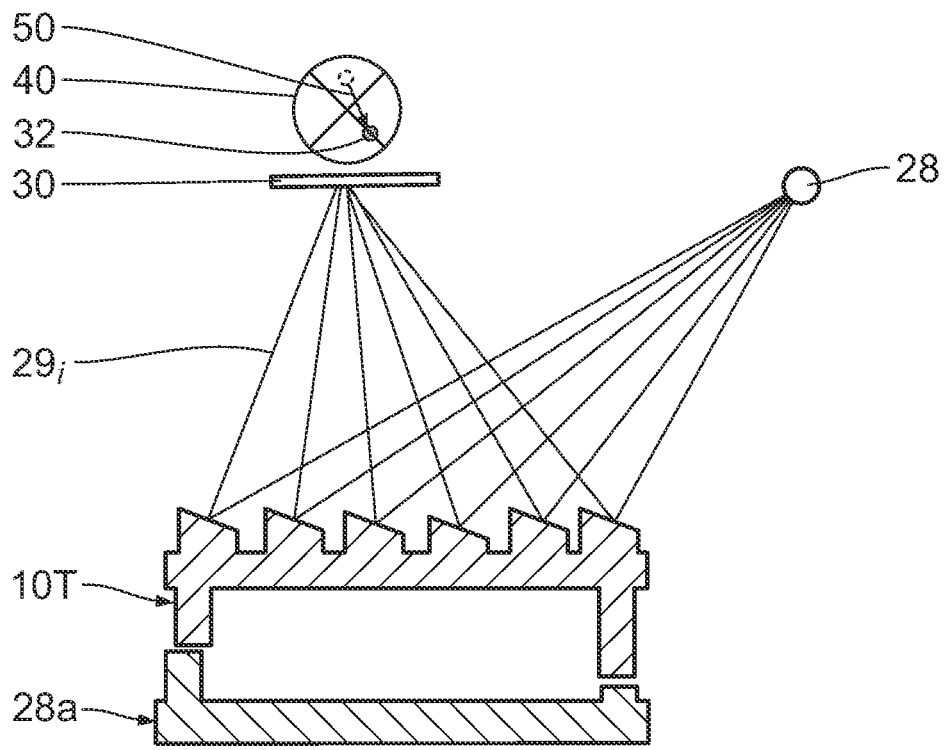
FIG. 14 shows, in an illustration similar to FIG. 13, the beam path in the position- and orientation data measuring device when measuring the replacement mirror according to FIG. 11.

FIG. 14 shows the replacement mirror 10T during measurement step 46. On account of the different relative positions of, firstly, the bearing points 13a, 13b and, secondly, the bearing points 13Ta, 13Tb, there is a global displacement of the measurement light spots 32, which is indicated schematically in FIGS. 13 and 14 by a displacement vector 50. Calculation step 48 and reworking of the bearing point are implemented, inter alia, on the basis of this global displacement.

Figure 15:
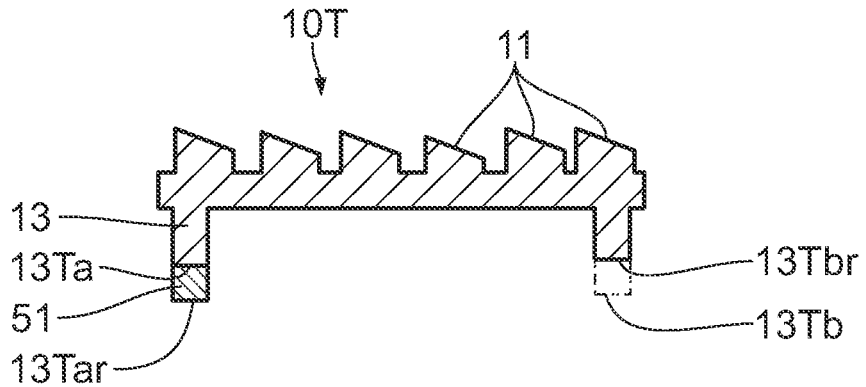
FIG. 15 shows, in an illustration similar to FIGS. 10 and 11, the replacement mirror following reworking of the bearing points thereof on the basis of ascertained differences between the position- and orientation data of, firstly, the mirror for replacement and, secondly, the replacement mirror, which were measured with the aid of the position- and orientation data measuring device.

FIG. 15 schematically shows the result of reworking the bearing points on the replacement mirror 10T. A spacer 51 has been attached in the region of the bearing point 13Ta, and so a resultant bearing point 13Tar now, in terms of its relative position to the remaining pupil facet carrier 13, corresponds to the position of the bearing point 13a of the pupil facet mirror 10 for replacement. Material ablation has occurred during the calculation and reworking step 48 in the region of the other bearing point 13Tb, and so the resultant bearing point 13Tbr, in terms of its position, corresponds to the position of the bearing point 13b of the pupil facet mirror 10 for replacement.

Figure 16:
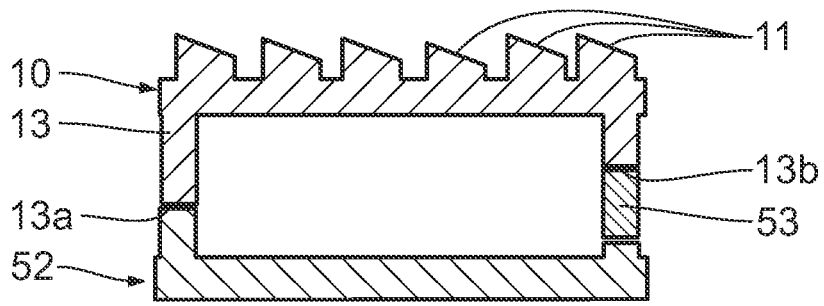
FIG. 16 shows, in an illustration similar to FIGS. 10 to 15, the mirror for replacement in a bearing receptacle of the projection exposure apparatus.
Figure 17:
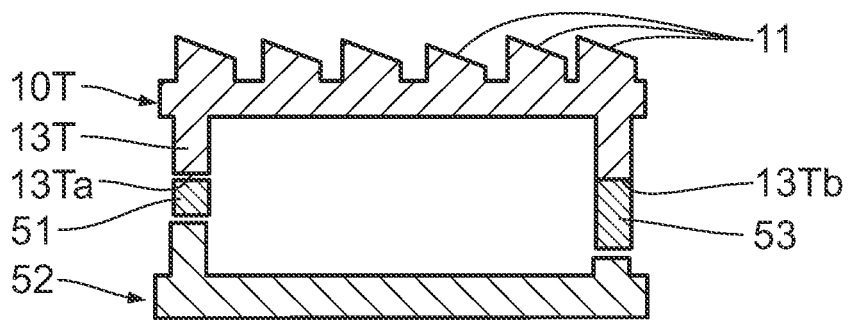
FIG. 17 shows, in an illustration similar to FIG. 16, the replacement mirror following the reworking of the bearing points thereof in the bearing receptacle according to FIG. 16.

FIGS. 16 and 17 show a comparison of, firstly, the pupil facet mirror 10 for replacement (FIG. 16) and, secondly, the replacement mirror 10T (FIG. 17) in a mirror receptacle 52 of the projection exposure apparatus 1 for holding the respective pupil facet mirror in the illumination optical unit 25.

In the holder of the (original) mirror 10 for replacement, an original spacer 53 is disposed between the bearing point 13b and an associated receptacle portion of the mirror receptacle 52 for the purposes of optimizing the adjustment.

FIG. 17 shows the conditions following a final installation step 54 of the replacement mirror 10T in the mirror receptacle 52 of the projection exposure apparatus 1. On account of the already reworked bearing points 13Tar and 13Tbr, both the mirror receptacle 52 and the original spacer 53 can be used without modification and the installed replacement mirror 10T has exactly the same position and orientation within the illumination optical unit 25 of the projection exposure apparatus 1 as the original mirror 10 for replacement.

Measuring 43 the position- and orientation data of the mirror 10 for replacement on the one hand and measuring 46 the position- and orientation data of the replacement mirror 10T on the other hand is implemented directly in succession and can occur, for example, within a time period of two hours or within an even shorter time period.

The measurement steps 43, 46 are implemented at one and the same location. Thus, there is no displacement overall of the position- and orientation data measuring device 27 between the measurement steps 43 and 46.

Then, following the replacement of the pupil facet mirror 10, as explained above, a portion of the reticle 19 is initially projected onto the wafer 24 with the aid of the projection exposure apparatus 1. Afterwards, the light-sensitive layer on the wafer 24 that has been exposed with the illumination light 3 is developed.

What is claimed is:

1. A method for replacing a mirror in a projection exposure apparatus, comprising:
   measuring position and orientation data of a mirror for replacement using a position and orientation data measuring device;
   measuring position and orientation data of a replacement mirror to be inserted in place of the mirror for replacement using the position and orientation data measuring device;
   reworking bearing points of the replacement mirror based on ascertained differences between, firstly, the measured position and orientation data of the mirror for replacement and, secondly, the measured position and orientation data of the replacement mirror; and
   installing the replacement mirror with the reworked bearing points as a substitute for the mirror for replacement.

2. The method according to claim 1, wherein said measuring of the position and orientation data of, firstly, the mirror for replacement and, secondly, the replacement mirror is implemented one directly in succession to another.

3. The method according to claim 1, wherein said measuring of the position and orientation data of, firstly, the mirror for replacement and, secondly, the replacement mirror is implemented at a mutually same location.

4. The method according to claim 1, wherein said reworking of the bearing points of the replacement mirror comprises inserting at least one spacer.

5. The method according to claim 1, wherein said reworking of the bearing points of the replacement mirror comprises implementing at least one instance of material ablation.

6. The method according to claim 1, wherein the mirror for replacement is a facet mirror, and wherein the facet mirror comprises a multiplicity of individual facets.

7. The method according to claim 1, wherein said measuring of the position and orientation data comprises reproducing an illumination beam path within the projection exposure apparatus.

8. The method according to claim 6, wherein a subset of illumination channels associated with the individual facets is detected during said measuring of the position and orientation data.

9. The method according to claim 7, wherein a subset of illumination channels associated with the individual facets is detected during said measuring of the position and orientation data.

10. The method according to claim 8, wherein the subset corresponds to an illumination setting of the projection exposure apparatus.

11. The method according to claim 8, wherein the subset is selected by stopping-down the illumination channels not to be measured.

12. A position and orientation data measuring device for carrying out a method according to claim 1, comprising:
   a light source for measurement light;
   a mirror holder for a mirror to be measured;
   a measurement light detection unit in a beam path of the measurement light downstream of the mirror holder;
   a stop for stopping-down the measurement light used for the measurement; and
   an imaging optical unit for imaging the stop onto an arrangement plane of the mirror holder.

13. The position and orientation data measuring device according to claim 12, wherein:
   the stop is disposed between the light source and the mirror holder, and
   the stop is disposed close to the mirror holder.

14. The method according to claim 1, further comprises removing the mirror for replacement from the projection exposure apparatus prior to said measuring of the position and orientation data of the replacement mirror.

* * * * *

UNITED STATES PATENT AND TRADEMARK OFFICE
CERTIFICATE OF CORRECTION

PATENT NO. : 11,500,294 B2
APPLICATION NO. : 17/340052
DATED : November 15, 2022
INVENTOR(S) : Petri et al.

It is certified that error appears in the above-identified patent and that said Letters Patent is hereby corrected as shown below:

On the Title Page

Column 2, in Line 4 Item (57) under "ABSTRACT", delete "position -and" and insert -- position-and --.

In the Specification

Column 3, Line 56, after "holder" insert -- . --.

Column 10, Line 20, delete "29A" and insert -- $29_A$ --.

Column 10, Line 53, delete "FIGS." and insert -- FIG. --.

Signed and Sealed this
Sixth Day of June, 2023

Katherine Kelly Vidal
*Director of the United States Patent and Trademark Office*